(12) United States Patent
Nad et al.

(10) Patent No.: US 11,501,967 B2
(45) Date of Patent: Nov. 15, 2022

(54) SELECTIVE METAL DEPOSITION BY PATTERNING DIRECT ELECTROLESS METAL PLATING

(71) Applicant: Intel Corporation, Santa Clara, CA (US)

(72) Inventors: Suddhasattwa Nad, Chandler, AZ (US); Roy Dittler, Chandler, AZ (US); Darko Grujicic, Chandler, AZ (US); Marcel Wall, Phoenix, AZ (US); Rahul Manepalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 770 days.

(21) Appl. No.: 16/269,357

(22) Filed: Feb. 6, 2019

(65) Prior Publication Data

US 2020/0251332 A1    Aug. 6, 2020

(51) Int. Cl.
*H01L 21/02* (2006.01)
*H01L 21/285* (2006.01)
*H01L 21/768* (2006.01)

(52) U.S. Cl.
CPC .. *H01L 21/02499* (2013.01); *H01L 21/02636* (2013.01); *H01L 21/28562* (2013.01); *H01L 21/76874* (2013.01)

(58) Field of Classification Search
CPC ......... H01L 21/02499; H01L 21/02636; H01L 21/28562; H01L 21/76874; H01L 23/49866; H01L 21/4846; H01L 21/76829; H01L 21/76885; H01L 2224/16225; H01L 2224/73204; H01L 2924/15311; H05K 3/184; H05K 3/389; H05K 2201/0195; H05K 2203/072; H05K 2203/1173

See application file for complete search history.

(56) References Cited

U.S. PATENT DOCUMENTS

| 3,783,005 A | * | 1/1974 | Kenney | ................... C23C 18/28 427/75 |
| 4,100,037 A | * | 7/1978 | Baron | ................. C23C 18/2086 205/187 |

(Continued)

FOREIGN PATENT DOCUMENTS

WO    WO-2014052792 A1  *  4/2014   ................ A61J 1/06

*Primary Examiner* — Mohammed Shamsuzzaman
(74) *Attorney, Agent, or Firm* — Schwabe, Williamson & Wyatt, P.C.

(57) ABSTRACT

Embodiments include package substrates and a method of forming the package substrates. A package substrate includes a self-assembled monolayer (SAM) layer over a first dielectric, where the SAM layer includes first end groups and second end groups. The second end groups may include a plurality of hydrophobic moieties. The package substrate also includes a conductive pad on the first dielectric, where the conductive pad has a bottom surface, a top surface, and a sidewall, and where the SAM layer surrounds and contacts a surface of the sidewall of the conductive pad. The hydrophobic moieties may include fluorinated moieties. The conductive pad includes a copper material, where the top surface of the conductive pad has a surface roughness that is approximately equal to a surface roughness of the as-plated copper material. The SAM layer may have a thickness that is approximately 0.1 nm to 20 nm.

12 Claims, 6 Drawing Sheets

(56) References Cited

U.S. PATENT DOCUMENTS

| | | | | |
|---|---|---|---|---|
| 5,468,597 A | * | 11/1995 | Calabrese | G03F 7/40 |
| | | | | 430/315 |
| 2008/0230773 A1 | * | 9/2008 | Dickey | B82Y 40/00 |
| | | | | 252/511 |
| 2009/0280243 A1 | * | 11/2009 | Mayer | C25F 5/00 |
| | | | | 427/331 |
| 2011/0146398 A1 | * | 6/2011 | Beck | G01F 1/6845 |
| | | | | 73/204.27 |

* cited by examiner

US 11,501,967 B2

SELECTIVE METAL DEPOSITION BY PATTERNING DIRECT ELECTROLESS METAL PLATING

FIELD

Embodiments relate to packaging semiconductor devices. More particularly, the embodiments relate to a package substrate having a conductive pad patterned with a fluorinated self-assembled monolayer (SAM), and a method for forming such package substrate.

BACKGROUND

For the past several decades, the scaling of features in integrated circuits has been a driving force behind an ever-growing semiconductor industry. Scaling to smaller and smaller features enables increased densities of functional units on the limited real estate of semiconductor devices, lending to the fabrication of products with increased capacity. The drive for ever-more capacity, however, is not without issue. The necessity to optimize the performance of each device becomes increasingly significant.

Substrates for next generation chip-to-chip interconnect technologies require significantly higher speed and higher density input/output (TO) routing. Next generation packaging solutions are trending to higher I/O densities to meet the rapidly increasing demand for greater connectivity and faster speeds. This drives semiconductor technologies to deliver ever-increasing complex packages, embedded silicon dies packages, and multi-chip enabled packages. Such packages typically require passive devices to be integrated close to the logic and/or memory dies. To meet this increasing demand, the semiconductor packaging roadmap is pressed to deliver a smaller blind micro vias (BMVs), a rapidly decreasing fine line spacing (FLS) requirement, and a finely reduced scaling of the pitch size.

Additionally manufacturing and integrating these complex passives devices into an organic substrate arises additional challenges. Some of these challenges include manufacturing uniformity for metallic thin-film deposition, handling package-level warpage, fine pitch scaling, and integrating advanced materials. For example, one of the main challenges when integrating high quality passives in organic substrate manufacturing is the uniformity and roughness of the deposited metallic thin layers/films.

The existing deposition processes (e.g., the semi-additive process (SAP)) necessitate the formation of a resist-defined electrolytically metallic layer, and then the underlying metal seed layer is removed using a chemical etch process, where the chemical etch process thereby roughens the remaining plated metallic layer. This roughness results in a high variability in the properties of any manufactured laminar passive device. Generally, the current packaging solutions may involve increasing the seed etch selectivity, while lowering the roughening property of the chemical solutions. In these cases, there are still significant challenges that need to be overcome in the development of the chemistries.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1A:
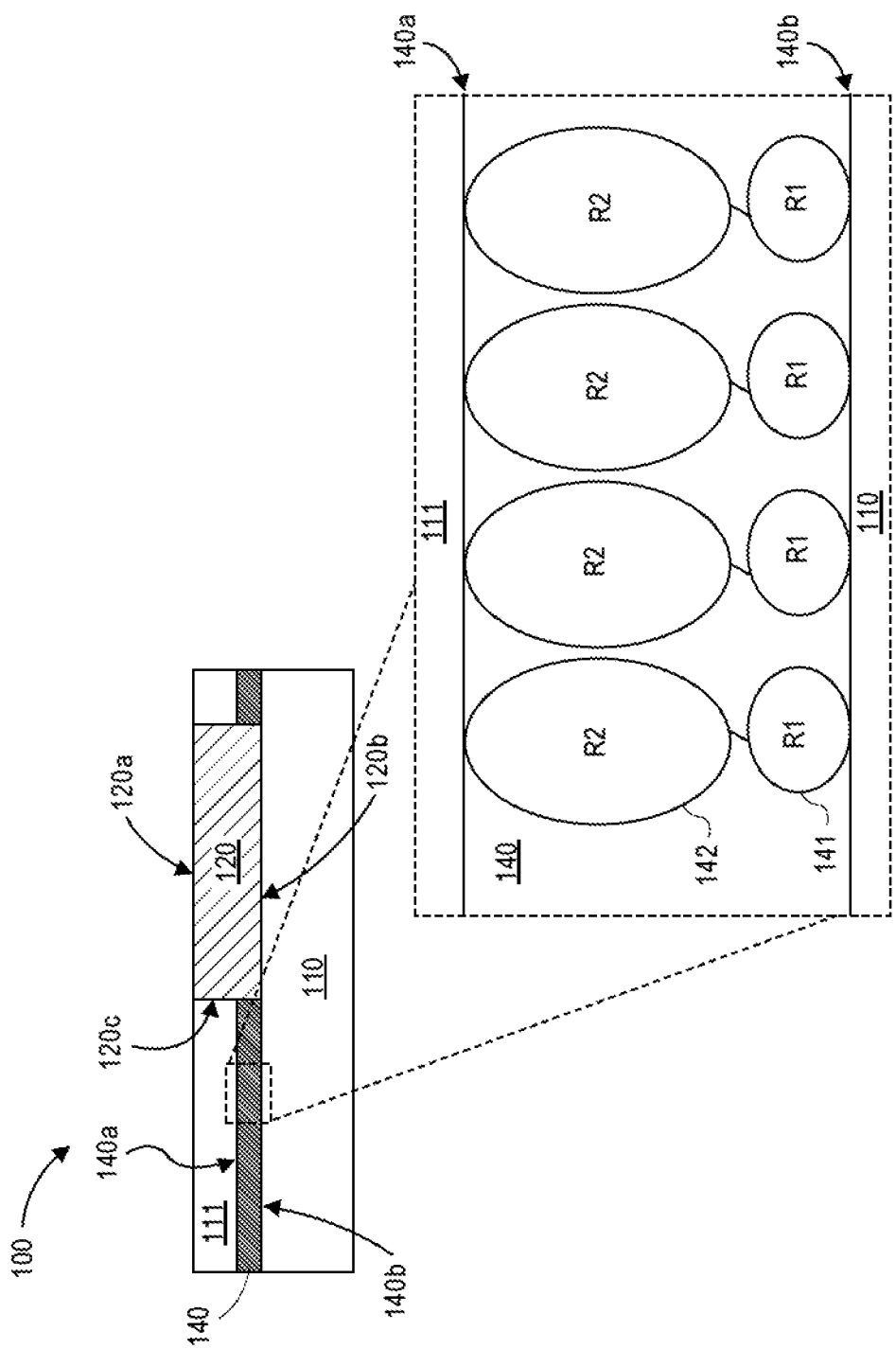
FIG. 1A is an illustration of a cross-sectional view of a package substrate having one or more dielectrics, a conductive pad, and a self-assembled monolayer (SAM) layer with a plurality of first end groups and a plurality of second end groups, according to one embodiment.

Described herein are package substrates having conductive pads that are patterned with self-assembled monolayer (SAM) layers. The package substrate described below and methods of forming such package substrate includes one or more dielectrics, a conductive pad, and a SAM layer with a plurality of first end groups (also referred to as R1) and a plurality of second end groups (also referred to as R2). Embodiments of the SAM layer may include a bifunctional SAM layer, where the plurality of first end groups may be a plurality of adhesion promoter moieties, and the plurality of second end groups may be a plurality of hydrophobic moieties (e.g., a plurality of fluorinated moieties). Embodiments of the bifunctional SAM layer enable improving the uniformity of a deposited metallic thin layer/film for application in integrated passive devices such as capacitors, inductors, and so on.

Furthermore, the embodiments described herein improve patterning the electroless seed deposition process and eliminate the need for treatments with etchant solutions. In some embodiments, the SAM layer may be implemented to create a pattern on a dielectric surface, where the patterned SAM layer may then repel the electroless chemistry of the electroless seed layer deposition, and thus prevents the deposition of the conductive thin layer (or the metallic thin film) except on the defined portions that are not covered by the SAM layer.

As described herein, a "SAM layer" (also referred to as a bifunctional SAM layer, and a bifunctional hydrophobic SAM) may refer to an organic layer (or an interfacial organic film) having hydrophobic moieties. As described herein, a "hydrophobic" moiety (or a hydrophobic chain) may refer to a molecular/chemical compound that may prevent palladium adsorption in the electroless copper plating process and does not reach with uncured photoresist material(s). For example, the hydrophobic moiety may be a moiety that substantially includes fluorinated alkanes (i.e., a fluorinated moiety). The hydrophobic moiety may be incorporated into the structure of the SAM layer described herein to change its physiochemical properties and thereby lead to much more desirable properties, such as preventing/repelling the formation of a conductive/metallic layer.

Embodiments of the bifunctional SAM layer described herein may include a plurality of R1 end groups that are amenable to the surface attachment, and a plurality of R2 hydrophobic end groups that prevent palladium adsorption in the electroless copper plating process. For example, in some embodiments, the R1 end groups may be implemented for an organic dielectric surface attachment, where the R1 end groups may include silicon (Si) containing groups (e.g., siloxane and/or any silanol derivatives), nitrogen (N) containing groups (e.g., amine, azole, pyridine, pyrrole, and/or any such derivatives), oxygen (O) containing groups (e.g., alcohols, ketones, aldehydes, etc.), and/or unsaturated aliphatic or aromatic containing groups (e.g., alkenes, alkynes, phenols, and/or any such derivatives); and the R2 end groups may be implemented as any hydrophobic moiety that does not react with uncured photoresist material, where the R2 end groups may include extensively fluorinated moieties (or fluorinated alkanes).

The SAM layer described herein may be implemented as an intermediate step during a standard semi-additive process (SAP) manufacturing of an organic electronic package. As described herein, the SAM layer may refer to a self-assembled layer(s) that are bifunctional with one end attaching to the dielectric surface and the other providing/presenting a hydrophobic surface to the electroless chemistry preventing the growth of the conductive layer (e.g., a copper thin layer). For example, in one embodiment, the SAM layer described herein may have siloxane moieties and fluorinated moieties, where the siloxane moieties attach to the composite dielectric polymers on the dielectric surface used as part of the standard build up process, and the fluorinated moieties (or fluorinated chains) provide the hydrophobic entity to repel the electroless chemistry of the electroless seed layer deposition and to prevent the deposition of the conductive thin layer except on the defined portions that are not covered by such SAM layer.

As described herein, a "fluorinated" moiety (or a fluorinated chain) may refer to a plurality of fluorine atoms that are incorporated into a molecular/chemical compound (e.g., perfluorooctyl triethoxysilane ($C_{14}H_{19}F_{13}O_3Si$)), where the fluorine atoms bond to form a fluorinated chain, and where incorporating the fluorine atoms into the structure of the SAM layer (or a fluorinated SAM layer) described herein changes its physiochemical properties to enable much more desirable properties, such as hydrophobic entities/properties.

In addition, the "SAM layer" may also refer to an organic SAM layer having hydrophobic moieties, and/or an organic SAM layer having hydrophobic moieties and inorganic moieties. As such, the "SAM layer" described herein refers to any interfacial organic SAM layer (or any organic SAM molecules) incorporated with a hydrophobic moiety (e.g., a fluorinated moiety) and attached to any one or more differing surface portions on either face/surface of the organic SAM layer—and is accordingly not limited to an adhesion promoter layer and/or a conductive/metal-dielectric interface.

In some embodiments, the SAM layer described herein may refer to one or more monolayers that may include one or more functional end groups (or desired functional end groups). As described herein, a "monolayer" may refer to a layer (or a film) of a given molecule, where the layer may be only one molecule thick on a surface structure. As such, as described herein, the SAM layer may include a monolayer formed by a reaction at a surface, where the reaction disposes molecules (or moieties) in the monolayer to line up in a uniform manner (or a customizable manner). For example, the molecules may "self-assemble" as each molecule may form a respective highly selective bond at the surface and position/orientate itself perpendicular to the face of the surface. Note that through such a reaction, according to some embodiments, a SAM layer may be formed which includes: (i) a uniform, well-defined monolayer (e.g., as shown with the SAM layer 140 of FIG. 1A); and/or (ii) a monolayer having a thickness of approximately only one or more molecules (or moieties), where the monolayer may be a reminisce of a prior SAM layer (that was subsequently removed) and thus only one or more hydrophobic molecules (e.g., fluorinated moieties) remain on one or more surfaces (or portions/areas) of the dielectric (e.g., as shown with the SAM layer 140' of FIG. 1B, where the monolayer may have one or more hydrophobic moiety thick portions/areas scattered on the dielectric surface). Also note that, in the context of any given monolayer, a molecule (or molecules) of the monolayer described herein refers to those molecules which are each of the majority molecule type in that monolayer.

According to some embodiments, the SAM layer is incorporated with hydrophobic moieties to improve packaging solutions that (i) enable a direct electroless patterning, (ii) provide a uniform thin film conductive/metallic patterning and plating process without any post-treatment of etchant solutions, (iii) implement a conductive layer with a substantially low roughness (i.e., a non-roughened surface on the conductive layer/pad as described below), (iv) enable the formation of low variability integrated passive devices/packages in the emerging fields of electronic packaging, such as embedded multi-die interconnect bridge (EMIB) packages, and/or panel level fan-out packages, (v) are fungible with existing and upcoming organic adhesion promotion chemistry/toolsets at copper-dielectric (Cu-dielectric) interface, thereby eliminating the need for any specialized toolsets, and (vi) facilitate the upcoming and proposed enhanced adhesion promotion solutions for improved adhesion of the electroless copper layers on non-roughened dielectrics, thereby eliminating the need to roughen the dielectric layer and the conductive layer.

Figure 1B:
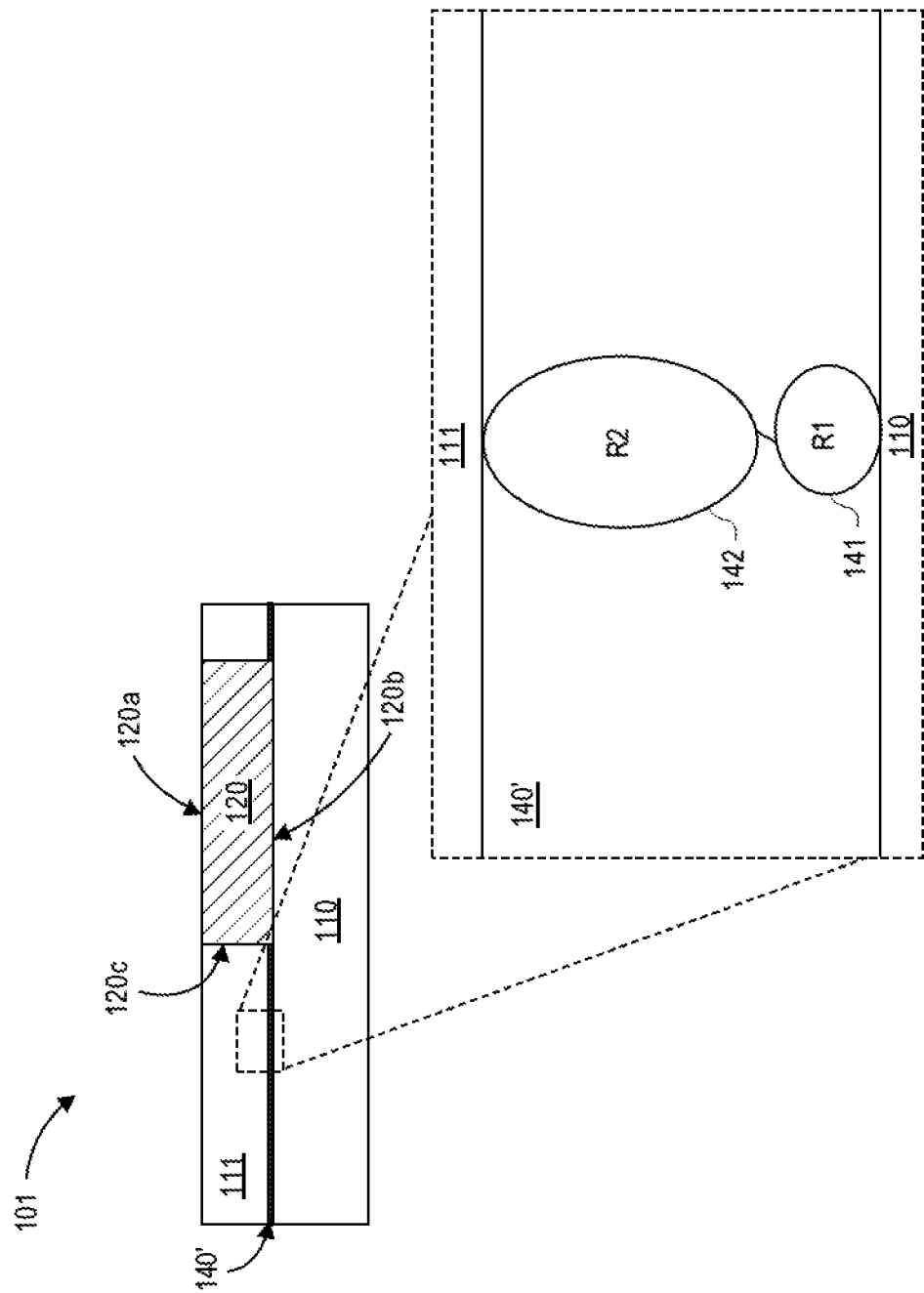
FIG. 1B is an illustration of a cross-sectional view of a package substrate having one or more dielectrics, a conductive pad, and a monolayer with a first end group and a second end group, according to one embodiment.

As described herein, a "non-roughened" surface may refer to a surface (or a portion/area) on a conductive layer that may include "non-roughened" surfaces and "roughened" surfaces, where a surface roughness of the "non-roughened" surface is less than a surface roughness of the "roughened surface." As such, the "non-roughened" surface may be the surface of the conductive layer (or the conductive pad) that is not treated with a chemical treatment, unlike the "roughened" surface that has been treated with the chemical treatment (e.g., the top surface 120a of the conductive pad 120 of FIGS. 1A-1B may be a "non-roughened" surface).

In some embodiments, the package substrate described herein may dispose a conductive pad on a dielectric (or a dielectric layer) using an electroless patterning process, which implements a SAM layer with fluorinated moieties to dispose a uniform thin conductive layer that forms the conductive pad. In these embodiments, the conductive pad and the dielectric layer do not require any post-chemical treatments such as etchant treatments/solutions. Accordingly, since no post-chemical treatments are needed, the top surface of the conductive pad may be a non-roughened surface that is substantially smooth and flat, where the non-roughened surface may maintain approximately the same surface roughness as the as-plated Cu surface roughness used to form the conductive pad (e.g., the as-plated Cu surface may have a first roughness of approximately 2 nm or less, a second roughness of approximately 18 nm or less, and/or a third roughness of approximately 50 nm or less).

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including package substrates having one or more dielectrics, conductive pads, and SAM layers with fluorinated moieties, where the SAM layers include a plurality of first end groups and a plurality of second end groups.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

FIG. 1A is an illustration of a cross-sectional view of a package substrate 100 having one or more dielectrics 110-111, a conductive pad 120, and a SAM layer 140, where the SAM layer 140 includes a plurality of first end groups 141 (R1) and a plurality of second end groups 142 (R2), according to one embodiment. In addition, FIG. 1A also illustrates an enlarged and detailed cross-sectional view of the SAM layer 140 having the first end groups 141 and the second end groups 142 disposed (or vertically assembled) on the first dielectric 110, according to one embodiment. Note that, even if the SAM layer with the different end groups is simply referred to as the SAM layer, the SAM layer described herein may be substantially incorporated with the hydrophobic moieties such as fluorinated moieties.

In FIG. 1A, a cross-sectional illustration of the package substrate 100 is shown, in accordance with an embodiment. In an embodiment, the package substrate 100 may include the conductive pad 120 disposed on the first dielectric layer 110. According to some embodiments, the package substrate 100 may include, but is not limited to, a substrate (e.g., one or more conductive/metal layers with dielectrics stacked on each other), a printed circuit board (PCB), and a motherboard. For one embodiment, the package substrate 100 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 100. For one embodiment, the PCB 100 may also include, but not limited to, the first and second dielectrics 110-111, the SAM layer 140 with R1 and R2 141-142, holes, and one or more conductive layers, such as the conductive pad 120 (or the conductive landing pad).

For one embodiment, the SAM layer 140 may have a top surface 140a and a bottom surface 140b that is opposite to the top surface 140a. In some embodiments, as shown in the enlarged, detailed view of the SAM layer 140, the SAM layer 140 may include a plurality of hydrophobic moieties 142 incorporated into one or more monolayers of the SAM layer 140. The SAM layer 140 may include a stack of monolayers (or a stack of SAMs) as the hydrophobic moieties 142 are incorporated in one monolayer, while the other monolayers of the stack may not be incorporated with hydrophobic moieties. Note that, in these embodiments where the SAM layer 140 has the stack of monolayers, the hydrophobic moieties 142 are incorporated (or positioned) in the topmost monolayer of the stack, where the topmost monolayer includes the top surface 140a of the SAM layer 140, as the hydrophobic moieties 142 of the topmost monolayer repel (or prevent) the electroless deposition of the conductive layer used to form the conductive pad 120.

In some embodiments, the SAM layer 140 may be disposed on and surround a portion (or a surface) of a sidewall(s) 120c of the conductive pad 120. According to some embodiments, the conductive pad 120 may include a top surface 120a, a bottom surface 120b, and one or more sidewalls 120c. The bottom surface 120b of the conductive pad 120 may be disposed on a top surface of the first dielectric 110. The bottom surface 140b of the SAM layer 140 may also be disposed on the top surface of the first dielectric 110. Accordingly, in some embodiments, the bottom surface 140b of the SAM layer 140 may be substantially coplanar to the bottom surface 120b of the conductive pad 120.

In one embodiment, the top surface 120a of the conductive pad 120 may be the top/outer surface of the conductive pad 120, where the top surface 120a is opposite to the bottom surface 120b. For one embodiment, the conductive pad 120 may be a thin metal landing pad (e.g., a Cu metal landing pad), where the thin metal landing pad may be one of a plurality of other landing pads formed by a thin metal conductive layer/film. In one embodiment, the conductive pad 120 may include, but is not limited to, Cu, gold (Au), silver (Ag), aluminum (Al), platinum (Pt), nickel (Ni), any combination herein, and/or any combination of one or more other conductive materials.

In some embodiments, as described above, the top surface 120a of the conductive pad 120 may be a non-roughened surface. In one embodiment, the non-roughened surface 120a of the conductive pad 120 may have a surface roughness that may maintain approximately the same surface roughness as the as-plated Cu surface roughness used to form the conductive pad 120. The top surface 120a of the conductive pad 120 may be substantially parallel to the top surface of the first dielectric 110. In an embodiment, the non-roughened surface 120a of the conductive pad 120 may have a surface roughness of approximately 2 nm or less. In another embodiment, the non-roughened surface 120a of the conductive pad 120 may have a surface roughness of approximately 18 nm or less. In one embodiment, the non-roughened surface 120a of the conductive pad 120 may have a surface roughness of approximately 50 nm or less.

According to some embodiments, based on existing patterning and plating technologies, the top surface 120a of the conductive pad 120 may have a surface roughness that is less than a surface roughness of existing conductive pads disposed/formed by existing electroless/electrolytic plating processes. For example, the top surface 120a of the conductive pad 120 may be a substantially flat and smooth Cu surface with an even topography as compared to a rough Cu surface with an uneven topography that is typically marked by finely spaced irregularities, protuberances, or ridges. For one embodiment, the top surface 120a of the conductive pad 120 may have a surface roughness of approximately 2-50 nm as compared to existing conductive pads that may have a surface roughness of approximately 350-600 nm.

Likewise, in some embodiments, the sidewall(s) 120c of the conductive pad 120 may be a non-roughened surface with a substantially flat and smooth Cu surface that has not been disposed/treated with a chemical treatment. In one embodiment, the sidewall 120c of the conductive pad 120 may have a portion/surface directly coupled and surrounded by the SAM layer 140. In some embodiments, the sidewall 120c of the conductive pad 120 may be a substantially vertical sidewall and/or a tapered sidewall. For an additional embodiment, the bottom surface 120b of the conductive pad 120 may respectively be coupled and surrounded by the SAM layer 140.

In some embodiments, the conductive pad 120 may have a dimension of approximately 2 nm×2 um. In one embodiment, the conductive pad 120 may have a z-height (or a thickness) of approximately 2 nm to 100 um, and a width of approximately 2 um to 1 cm. For some embodiments, the top surface 120a of the conductive pad 120 may have a z-height that is greater than a z-height of the top surface 140a of the SAM layer 140. For one embodiment, the SAM layer 140 may have a z-height of approximately 0.1 nm to 20 nm. In alternate embodiments, the SAM layer 140 may have a z-height of approximately 0.1 nm or less (e.g., as shown with the SAM layer 140' of FIG. 1B, where the z-height of the SAM layer 140' may be approximately the thickness of one hydrophobic molecule 142).

For some embodiments, the second dielectric 111 may be disposed on and contacts the top surface 140a of the SAM layer 140. In one embodiment, the second dielectric 111 may also be disposed on and surrounds the remaining portion of the sidewalls 120c of the conductive pad 120, where the remaining portion of the sidewall 120c is the portion not surrounded (or covered) by the SAM layer 140. In an embodiment, the second dielectric 111 may have a top surface that is substantially coplanar to the top surface 120a of the conductive pad 120. In other embodiments, the second dielectric 111 may have a top surface with a z-height greater than a z-height of the top surface 120a of the conductive pad 120.

For one embodiment, the SAM layer 140 may be disposed (or sandwiched) between the first and second dielectrics 110-111, where the bottom surface 140b of the SAM layer 140 may be disposed directly on the top surface of the first dielectric 110, and the top surface 140a of the SAM layer 140 may be disposed directly on the bottom surface of the second dielectric 111. In some embodiments, the SAM layer 140 may be a single monolayer (or a stack of monolayers) that has a substantially well-defined thickness, where the substantially well-defined thickness may be approximately 0.1 nm to 20 nm between the top and bottom surfaces 140a-b of the SAM layer 140.

In some embodiments, the first and second dielectrics 110-111 may be formed by stacking a plurality of dielectric films/layers. For some embodiments, the first and second dielectrics 110-111 may be a polymer material, such as, but not limited to, a dry film resist (DFR), a polyimide, an epoxy, or a BF (e.g., any of various silica particle filled epoxy materials). In additional embodiments, the first and second dielectrics 110-111 may be a polyimide (PI), polytetrafluoroethylene (PTFE), a liquid crystal polymer (LCP), and polyetheretherketone (PEEK). In some embodiments, the first and second dielectrics 110-111 may also include a laminate material such as FR4, FR5, bismaleimide triazine (BT) resin, or the like. In one embodiment, the first and second dielectrics 110-111 may be two dielectric layers in a stack that includes additional dielectric layers used to form a build-up structure. As such, the first and second dielectrics 110-111 may be formed over other dielectric layers. Additional embodiments may include disposing the first dielectric layer 110 as the first dielectric layer over a core material on which the stack is formed.

Now referring to the enlarged, detailed view of the SAM layer 140, the SAM layer 140 may be a single monolayer that includes a plurality of first end groups 141 and a plurality of second end groups 142. The SAM layer 140 may include a plurality of R1 end groups 141 that are amenable to the surface attachment (or adhesion promoters), and a plurality of R2 hydrophobic end groups that prevent palladium adsorption in the electroless copper plating process. For example, in some embodiments, the R1 end groups 141 may be implemented for an organic dielectric surface attachment, where the R1 end groups 141 may include Si containing groups (or Si molecular compounds) (e.g., siloxane and/or any silanol derivatives), N containing groups (or N molecular compounds) (e.g., amine, azole, pyridine, pyrrole, and/or any such derivatives), O containing groups (or O molecular compounds) (e.g., alcohols, ketones, aldehydes, etc.), and/or unsaturated aliphatic or aromatic containing groups (or unsaturated aliphatic/aromatic molecular compounds) (e.g., alkenes, alkynes, phenols, and/or any such derivatives). In addition, for some embodiments, the R2 end groups 142 may be implemented as any hydrophobic moieties that does not react with uncured photoresist material, where the R2 end groups may include extensively fluorinated moieties (or fluorinated alkanes).

In one embodiment, the first and second end groups 141-142 of the SAM layer 140 may be incorporated and assembled together with backbones to form, for example, a perfluorooctyltriethoxysilane SAM layer (or a perfluorooctyltriethoxysilane monolayer) (e.g., a SAM layer having the molecular formula of $C_{14}H_{19}F_{13}O_3Si$). For one embodiment, the perfluorooctyltriethoxysilane monolayer of the SAM layer 140 may be a bifunctional monolayer with the first end groups 141 coupled (or attached) to the top surface of the first dielectric 110, and the second end groups 142 are coupled to the bottom surface of the second dielectric 111. The second end groups 142 may include the moieties that provide a hydrophobic surface to the electroless chemistry and that prevent the growth of the conductive layer on the top surface 140a of the SAM layer 140. While the first end groups 141 may include the siloxane moieties that provide an adhesion promotion surface, which enables an improved bond between the bottom surface 140b of the SAM layer 140 and the first dielectric 110. As described above, the SAM layer 140 may be a single monolayer or a stack of monolayers.

Note that the package substrate 100 of FIG. 1A may include fewer or additional packaging components based on the desired packaging design.

FIG. 1B is an illustration of a cross-sectional view of a package substrate 101 having one or more dielectrics 110-111, a conductive pad 120, and a SAM layer 140' with hydrophobic moieties 142, according to one embodiment. In addition, FIG. 1B also illustrates an enlarged and detailed cross-sectional view of the SAM layer 140' having one or more hydrophobic moieties 142 disposed (or vertically assembled) on the first dielectric 110, according to one embodiment.

Referring now to 1B, a cross-sectional illustration of a package substrate 101 with a SAM layer 140' is shown, in accordance with an embodiment. In an embodiment, the package substrate 101 may be substantially similar to the package substrate 100 of FIG. 1A, with the exception that the SAM layer 140' may be a monolayer that has a thickness of approximately only one or more hydrophobic moieties 142—unlike the SAM layer 140 of FIG. 1A that has a uniform, well-defined thickness with a plurality of hydrophobic moieties 142. Whereas the second dielectric 111 may only be disposed directly on the top surface 140a of the SAM layer 140 in FIG. 1, the second dielectric 111 may be disposed on the SAM layer 140' and the first dielectric 110 in FIG. 1B. That is, in some portions of the package substrate 101, the second dielectric 111 may be disposed directly on the first dielectric 111, and, in other portions of the package substrate 101, the second dielectric 111 may be disposed on the SAM layer 140' that is disposed on/over some portions of the first dielectric 111.

For example, in some embodiments, the package substrate 101 may have initially disposed a SAM layer with hydrophobic moieties, such as the SAM layer 140 with hydrophobic moieties 142 shown in FIG. 1A, and then subsequently removed the SAM layer with a removal process, where the removal process may have substantially removed the SAM layer and thus only one or more hydrophobic molecules remain on one or more portions of the first dielectric 110 (e.g., as illustrated in the process flow shown in FIGS. 2E-2F). As shown in FIG. 1B, the SAM layer 140' may only include one or more hydrophobic moiety thick portions that are scattered on the top surface of the first dielectric 110. Accordingly, in some embodiments, the SAM layer 140' may be substantially coplanar with the bottom surface 120b of the conductive pad. Additionally, in an embodiment, the SAM layer 140' may have a thickness of approximately only one hydrophobic moiety 142, where the SAM layer 140' may have a thickness that is approximately less than a thickness of the SAM layer 140 of FIG. 1A.

FIGS. 2A-2F are illustrations of cross-sectional views of a process flow to form a package substrate 200 having a dielectric 210, a conductive pad 220, and a SAM layer 240, according to some embodiments. FIGS. 2A-2F are a series of cross-sectional illustrations that depict a process using a SAM layer with hydrophobic moieties to create a lithographically defined conductive pad, which has a top surface with a substantially low surface roughness, in accordance with an embodiment. As described above, in particular, FIGS. 2A-2F illustrate an inverted patterning process that implements a thin conductive pad with a substantially flat and smooth top surface, thereby enabling an integrated passive device (e.g., an embedded thin capacitor) and/or an EMIB to be ideally disposed on such top surface of the conductive pad. In an embodiment, the package substrate 200 of FIGS. 2A-2F may be substantially similar to the package substrates 100-101 of FIGS. 1A-1B.

Furthermore, FIGS. 2A-2F illustrate a method to form the package substrate 200, where the method improves the uniformity of deposited thin metallic layers for applications in integrated passives, etc. The process flow illustrated by FIGS. 2A-2F patterns the electroless metallic seed deposition process, and eliminates the need for using chemical treatments with etchant solutions, by implementing a bifunctional SAM layer that creates a pattern on a dielectric surface, where the bifunctional SAM layer prevents the electroless metallic seed layer to grow (or be formed) on the dielectric surface except in the patterned surfaces that are not covered with the bifunctional SAM layer.

Figure 2A:
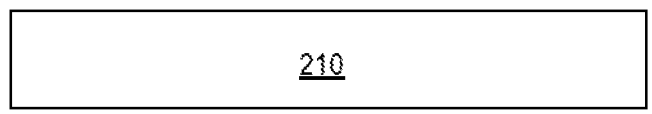
FIGS. 2A-2F are illustrations of cross-sectional views of a process flow to form a package substrate having a dielectric, a conductive pad, and a SAM layer with a plurality of first end groups and a plurality of second end groups, according to some embodiments.

Referring now to FIG. 2A, a cross-sectional illustration of a package substrate 200 with a dielectric 210 is shown, in accordance with an embodiment. In one embodiment, the package substrate 200 may include the dielectric 210. The dielectric 210 may be substantially similar to the first dielectric 110 of FIGS. 1A-1B. In one embodiment, the dielectric 210 may be a polymer material such as, for example, a polyimide, an epoxy, or a build-up film (BF). For one embodiment, the dielectric 210 may be a first dielectric disposed over a carrier, where the first dielectric may be stacked with additional dielectrics, conductive layers, etc., to form the build-up structure of the package substrate 200.

Figure 2B:
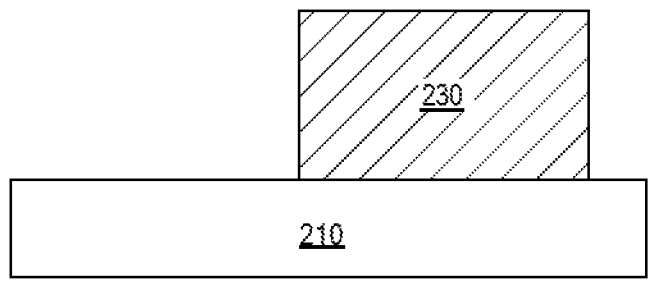

Referring now to FIG. 2B, a cross-sectional illustration of a package substrate 200 with a resist 230 (or a resist layer) is shown, in accordance with an embodiment. In an embodiment, the resist 230 may be disposed on the top surface of the dielectric 210. For one embodiment, the resist 230 may be a dry-film resist (DFR). For some embodiments, the package substrate 200 may be initially patterned with a standard lithography process that may dispose, expose, and develop the resist 230 on the dielectric 210 to form a patterned surface on the dielectric 210. The patterned surface on the dielectric 210 may include an exposed surface and a covered surface. The covered surface may be covered by the patterned resist 230, while the exposed surface is not covered by the patterned resist 230 and may subsequently provide the opening(s) for a SAM layer.

Figure 2C:
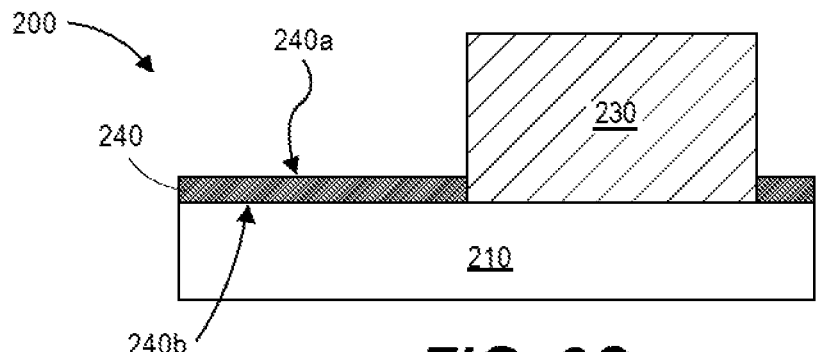

Referring now to FIG. 2C, a cross-sectional illustration of a package substrate 200 with a bifunctional hydrophobic SAM layer 240 is shown, in accordance with an embodiment. In an embodiment, the SAM layer 240 may be disposed over the patterned surface of the dielectric 210. As shown in FIG. 2C, the SAM layer 240 may be disposed directly onto the exposed surface of the dielectric 210, while the covered surface of the dielectric 210 remains covered by the resist 230. Accordingly, the package substrate 200 may implement the SAM layer 240 to form a patterned mask over/on the dielectric 210. The SAM layer 240 may be substantially similar to the SAM layer 140 of FIG. 1A. That is, as described above for example, the SAM layer 240 may be a single monolayer that may include fluorinated moieties and siloxane moieties, where the single monolayer may have a well-defined thickness of approximately 0.1 nm to 20 nm, according to some embodiments.

As described above, the SAM layer 240 may be implemented as an intermediate step during the standard SAP manufacturing of the package substrate 200. In an embodiment, the SAM layer 240 may be a bifunctional SAM layer having a top surface 240a and a bottom surface 240b. The bifunctional SAM layer 240 may have the bottom surface 240b attach to the exposed top surface of the dielectric 210, while the top surface 240a provides a hydrophobic surface to the electroless chemistry to prevent the growth of a thin conductive layer (or a thin metallic seed layer). For example, the SAM layer 240 may have siloxane moieties that attach to the composite dielectric polymer(s) of the dielectric 210 and fluorinated moieties that provide the hydrophobic entity to substantially repel the thin metallic seed layer.

Figure 2D:
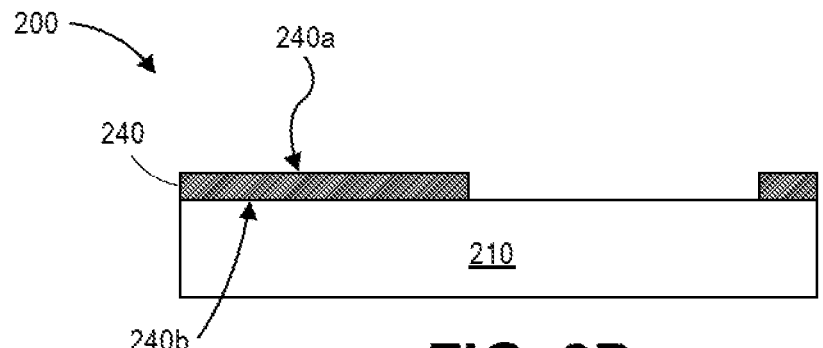

Referring now to FIG. 2D, a cross-sectional illustration of a package substrate 200 is shown after the resist is removed, in accordance with an embodiment. In an embodiment, the package substrate 200 may remove (or strip away) the resist from the top surface of the dielectric 210 without impacting the SAM layer 240. In one embodiment, after removing the resist, the SAM layer 240 may provide a patterned mask over/on the dielectric 210 as the top surface of the dielectric 210 may either be exposed or covered by the SAM layer 240. Accordingly, the exposed surface of the dielectric 210 may provide an opening over the dielectric 210 to form a thin conductive pad.

Figure 2E:
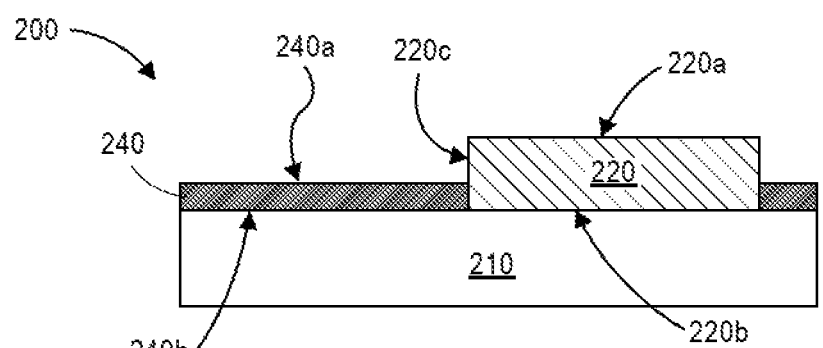

Referring now to FIG. 2E, a cross-sectional illustration of a package substrate 200 with a conductive pad 220 is shown, in accordance with an embodiment. In an embodiment, the conductive pad 220 may be disposed on the exposed surface of the dielectric 210. For example, the conductive pad 220 may be disposed into the opening that was formed through the SAM layer 240, where an electroless deposition may be implemented to selectively dispose (or deposit) the conductive/metallic seed layer directly into the patterned opening(s) of the SAM layer 240 and over the exposed surface of the dielectric 210. As described above, the SAM layer 240 may enable hydrophobic entities that prohibit (or prevent/repel) the palladium (Pd) seeds of the thin conductive layer to attach in the first step of the electroless process, prohibiting the formation of the thin conductive layer on any surface of the dielectric 210 that is covered by the SAM layer 240, and thus resulting in the Pd seeds of the thin conductive layer being selectively deposited only in/on the exposed surface(s) of the dielectric 210 to form the conductive pad 220.

Accordingly, in some embodiments, the conductive pad 220 may include a top surface 220a, a bottom surface 220b, and a sidewall(s) 220c. As described above, the bottom surface 240b of the SAM layer 240 may be substantially coplanar to the bottom surface 220b of the conductive pad 220. In one embodiment, the top surface 220a of the conductive pad 220 may be the top/outer surface of the conductive pad 220. For one embodiment, the conductive pad 220 may be a thin metal landing pad (e.g., a Cu metal landing pad).

In some embodiments, the top surface 220a of the conductive pad 220 may be a non-roughened surface. In one embodiment, the non-roughened surface 220a of the conductive pad 220 may have a surface roughness that may maintain approximately the same surface roughness as the as-plated Cu surface roughness used to form the conductive pad 220. The top surface 220a of the conductive pad 220 may be substantially parallel to the top surface of the dielectric 210. In an embodiment, the non-roughened surface 220a of the conductive pad 220 may have a surface roughness of approximately 2 nm or less. In another embodiment, the non-roughened surface 220a of the conductive pad 220 may have a surface roughness of approximately 18 nm or less. In one embodiment, the non-roughened surface 220a of the conductive pad 220 may have a surface roughness of approximately 50 nm or less.

According to some embodiments, based on existing patterning and plating technologies, the top surface 220a of the conductive pad 220 may have a surface roughness that is less than a surface roughness of existing conductive pads disposed/formed by existing electroless/electrolytic plating processes. For one embodiment, the top surface 220a of the conductive pad 220 may have a surface roughness of approximately 2-50 nm as compared to existing conductive pads that may have a surface roughness of approximately 350-600 nm.

Likewise, in some embodiments, the sidewall(s) 220c of the conductive pad 220 may be a non-roughened surface with a substantially flat and smooth Cu surface that has not been disposed/treated with a chemical treatment. In one embodiment, the sidewall 220c of the conductive pad 220 may have a portion/surface directly coupled and surrounded by the SAM layer 240 (or the SAM layer 240' of FIG. 2F). In some embodiments, the sidewall 220c of the conductive pad 220 may be a substantially vertical sidewall and/or a tapered sidewall. For an additional embodiment, the bottom surface 220b of the conductive pad 220 may respectively be coupled and surrounded by the SAM layer 240.

In some embodiments, the conductive pad 220 may have a dimension of approximately 2 nm×2 um. In one embodiment, the conductive pad 220 may have a z-height of approximately 2 nm to 100 um, and a width of approximately 2 um to 1 cm. For some embodiments, the top surface 220a of the conductive pad 220 may have a z-height that is greater than a z-height of the top surface 240a of the SAM layer 240. For one embodiment, the SAM layer 240 may have a z-height of approximately 0.1 nm to 20 nm. In alternate embodiments, the SAM layer 240 may have a z-height of approximately 0.1 nm or less (e.g., as shown with the SAM layer 240' of FIG. 2B, where the z-height of the SAM layer 240' may be approximately the thickness of one hydrophobic molecule, in an embodiment).

Note that, after the conductive pad 220 is formed, the package substrate 200 may dispose a second dielectric over the SAM layer 240, the conductive pad, and the dielectric 210 to dispose (or form) a subsequent conductive layer on the conductive pad 220 and/or the second dielectric, according to some embodiments (e.g., as shown with the package substrate 100 of FIG. 1A). Alternatively, as shown in FIG. 2F, after the conductive pad 220 is formed, the package substrate 200 may remove the SAM layer 240 from the top surface of the dielectric 210—prior to subsequently disposing a second dielectric over the dielectric 210 and the conductive pad 220, according to other embodiments (e.g., as shown with the package substrate 101 of FIG. 1B).

Figure 2F:
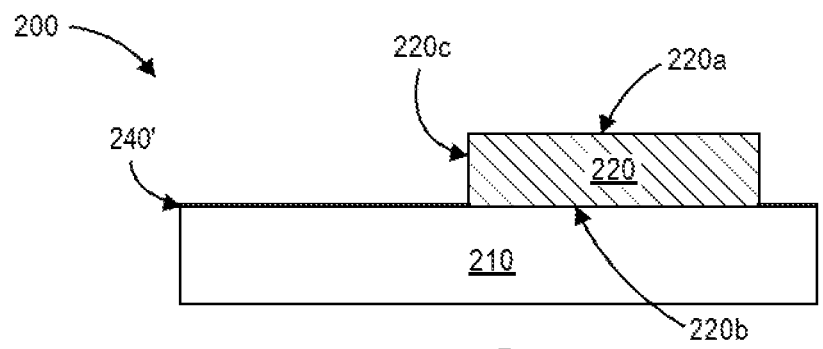

Referring now to FIG. 2F, a cross-sectional illustration of an electronic package 200 is shown after the SAM layer is removed, in accordance with an embodiment. In an embodiment, the package substrate 200 may remove the SAM layer 240 from the top surface of the dielectric 210. As described above, the removal process of the SAM layer may leave one or more scattered portions of a SAM layer 240'. In some embodiments, the remaining SAM layer 240' may be a reminisce of the SAM layer 240 of FIG. 2E, and may only include at least one hydrophobic moiety on the top surface of the dielectric 210. As such, in these embodiments, the SAM layer 240' may be substantially coplanar to the bottom surface 220b of the conductive pad, where the one or more scattered portions of the SAM layer 240' may be disposed near/at the bottom portion/surface of the sidewall 220c of the conductive pad 220. Note that the step illustrated in FIG. 2F may be optional based on the desired packaging application/design.

Also note that the package substrate 200 as shown in FIGS. 2A-2F may include fewer or additional packaging components based on the desired packaging design.

Figure 3:
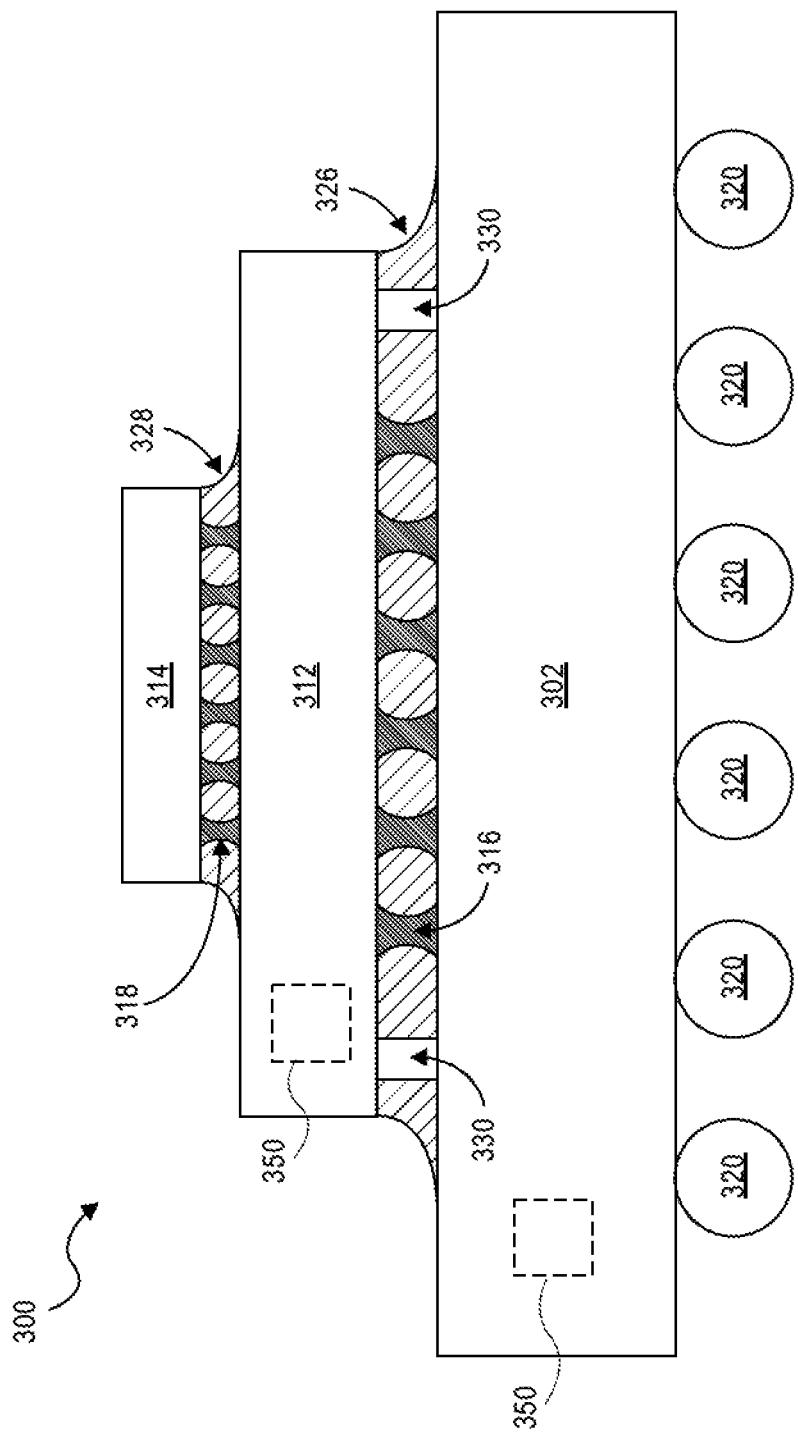
FIG. 3 is an illustration of a cross-sectional view of a semiconductor packaged system including a die, a substrate, and a package substrate, where the substrate and/or the package substrate include a SAM layer with a plurality of first end groups and a plurality of second end groups, according to one embodiment.

FIG. 3 is an illustration of a cross-sectional view of a semiconductor packaged system 300 including a die 314, a substrate 312, a package substrate 302, and one or more build-up structures 350, according to one embodiment. FIG. 3 illustrates a semiconductor package 300 including a die 314, a substrate 312 (or an interposer), interconnect structures (e.g., the plurality of bumps disposed below the die 314 and the substrate 312), and the package substrate 302, where the substrate 312 and/or the package substrate 302 may include the one or more build-up structures 350, according to some embodiments.

For one embodiment, the semiconductor package 300 may implement the substrate 312 and/or the package substrate 302 to include a build-up structure 350 (as the build-up structures of the package substrates described herein). In one embodiment, the build-up structure 350 may include one or more dielectrics, one or more conductive pads (and/or conductive layers), and one or more SAM layers (e.g., the SAM layer 140 and 140' of FIGS. 1A-1B). As described above, the build-up structure(s) 350 may include one or more SAM layers with hydrophobic moieties that enable creating lithographically defined conductive pads/layers which have substantially low surface roughness. In one embodiment, the build-up structure(s) 350 of the substrate 312 and/or the package substrate 302 may be substantially similar to the package substrates 100-101 and 200 of FIGS. 1A-2. Note that the semiconductor package 300 is not limited to the illustrated semiconductor packaged system, and thus may be designed/formed with fewer, alternate, or additional packaging components and/or with different interconnecting structures.

According to one embodiment, the semiconductor package 300 is merely one example of an embodiment of a semiconductor packaged system. For one embodiment, the semiconductor package 300 may include a ball grid array (BGA) package, a land grid array (LGA) package, and/or a pin grid array (PGA) package. For one embodiment, a die 314 is coupled to a substrate 312 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 314, the substrate 312, and the package substrate 302 may be coupled using anisotropic conductive film (ACF). For one embodiment, the substrate 312 may be, but is not limited to, a silicon interposer and/or a die with through silicon vias (TSVs). For an alternate embodiment, the semiconductor package 300 may omit the interposer/substrate 312.

For some embodiments, the semiconductor package 300 may have the die 314 disposed on the interposer 312, where both the stacked die 314 and interposer 312 are disposed on a package substrate 302. According to some embodiments, the package substrate 302 may include, but is not limited to, a package, a substrate, a PCB, and a motherboard. For one embodiment, the package substrate 302 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 302. For one embodiment, the PCB 302 may also include conductive layers that comprise copper lines/traces, metallic pads, vias, via pads, planes, and/or holes.

For one embodiment, the die 314 may include, but is not limited to, a semiconductor die, an electronic device (e.g., a wireless device), an integrated circuit (IC), a central processing unit (CPU), a microprocessor, a platform controller hub (PCH), a memory, and/or a field-programmable gate array (FPGA). The die 314 may be formed from a material such as silicon and have circuitry thereon that is to be coupled to the interposer 312. Although some embodiments are not limited in this regard, the package substrate 302 may in turn be coupled to another body, for example, a computer motherboard. One or more connections between the package substrate 302, the interposer 312, and the die 314—e.g., including some or all of bumps 316, 318, and 320—may include one or more interconnect structures and underfill layers 326 and 328. In some embodiments, these interconnect structures (or connections) may variously comprise an alloy of nickel, palladium, and tin (and, in some embodiments, Cu).

Connections between the package substrate 302 and another body may be made using any suitable structure, such as the illustrative bumps 320 shown. The package substrate 302 may include a variety of electronic structures formed thereon or therein. The interposer 312 may also include electronic structures formed thereon or therein, which may be used to couple the die 314 to the package substrate 302. For one embodiment, one or more different materials may be used for forming the package substrate 302 and the interposer 312. In certain embodiments, the package substrate 302 is an organic substrate made up of one or more layers of polymer base material, with conducting regions for transmitting signals. In certain embodiments, the interposer 312 is made up of a ceramic base material including metal regions for transmitting signals. Although some embodiments are not limited in this regard, the semiconductor package 300 may include gap control structures 330—e.g., positioned between the package substrate 302 and the interposer 312. Such gap control structures 330 may mitigate a change in the height of the gap between the package substrate 302 and the interposer 312, which otherwise might occur during reflowing while die 314 is attached to interposer 312. Note that the semiconductor package 300 includes an underfill material 328 between the interposer 312 and the die 314, and an underflow material 326 between the package substrate 302 and the interposer 312. For one embodiment, the underfill materials (or layers) 326 and 328 may be one or more polymers that are injected between the layers. For other embodiments, the underfill materials may be molded underfills (MUF).

Note that the semiconductor package 300 may include fewer or additional packaging components based on the desired packaging design.

Figure 4:
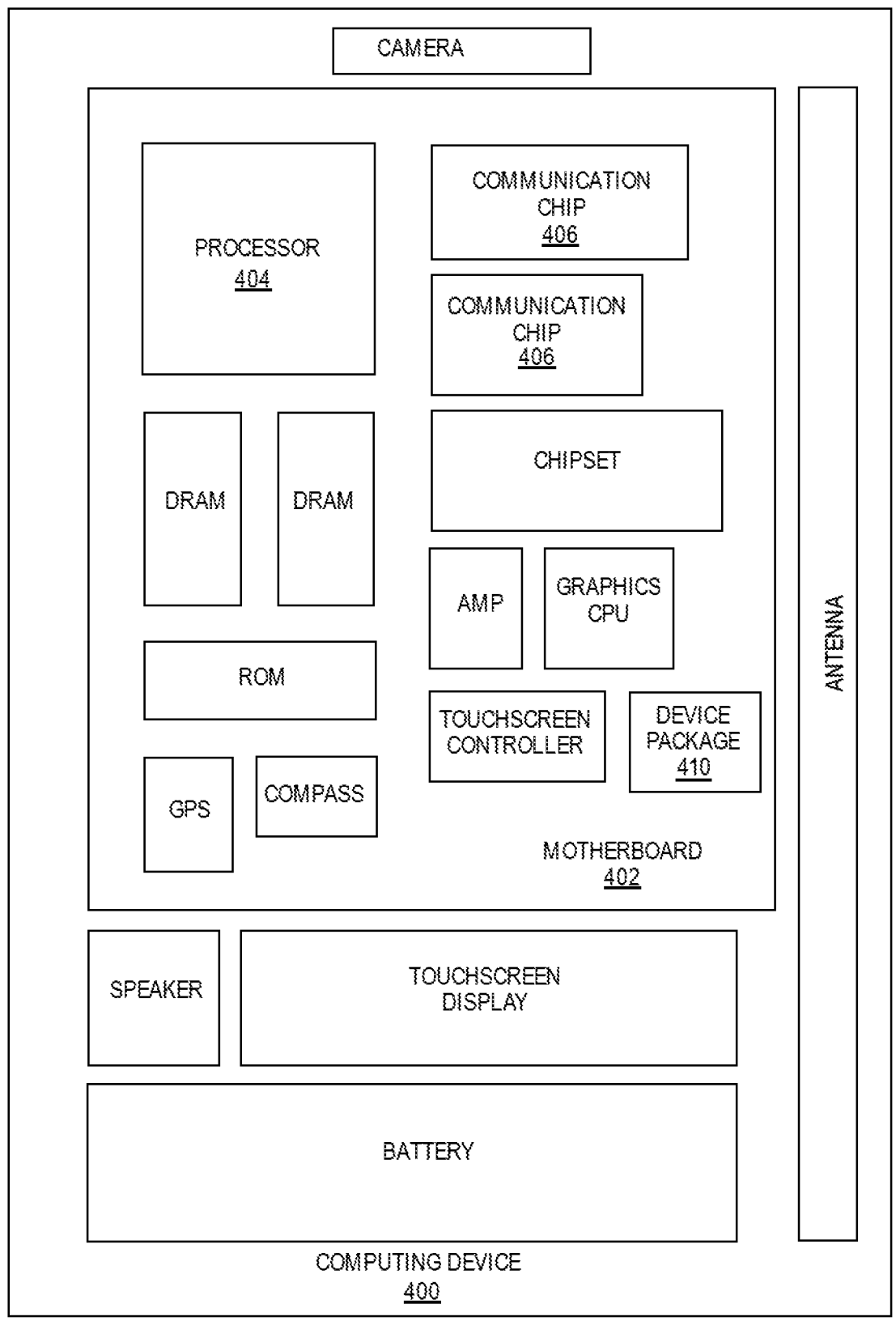
FIG. 4 is an illustration of a schematic block diagram illustrating a computer system that utilizes a semiconductor package having a dielectric, a conductive pad, and a SAM layer with a plurality of first end groups and a plurality of second end groups, according to one embodiment.

FIG. 4 is an illustration of a schematic block diagram illustrating a computer system 400 that utilizes a device package 410 (or a package substrate) having one or more dielectrics, one or more conductive pads (and/or conductive layers), and one or more bifunctional hydrophobic SAM layers, according to some embodiments. FIG. 4 illustrates an example of computing device 400. Computing device 400 houses motherboard 402. For one embodiment, motherboard 402 may be similar to the package substrates 100-101, 200, and 302 of FIGS. 1A-3. Motherboard 402 may include a number of components, including but not limited to processor 404, device package 410 (or semiconductor package), and at least one communication chip 406. Processor 404 is physically and electrically coupled to motherboard 402. For some embodiments, at least one communication chip 406 is also physically and electrically coupled to motherboard 402. For other embodiments, at least one communication chip 406 is part of processor 404.

Depending on its applications, computing device 400 may include other components that may or may not be physically and electrically coupled to motherboard 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. Device package 410 may be, but is not limited to, a substrate, a package substrate, and/or a PCB. Device package 410 may include one or more dielectrics, one or more conductive pads (and/or conductive layers), and one or more bifunctional hydrophobic SAM layers (e.g., as illustrated in FIGS. 1A-3)—or any other components from the figures described herein. The device package 410 of the computing device 400 may thus implement SAM layers with fluorinated moieties that enable creating lithographically defined conductive pads/layers, where the conductive pads/layers have substantially low surface roughness to dispose/form, for example, complex integrated passive devices and so on, and where the conductive pads/layers and the dielectric(s) do not necessitate post-chemical treatments.

Note that device package 410 may be a single component/device, a subset of components, and/or an entire system, as the materials, features, and components may be limited to device package 410 and/or any other component of the computing device 400 that may need package substrates having hydrophobic SAM layers (e.g., the motherboard 402, the processor 404, and/or any other component of the computing device 400 may need the package substrates (or components/structures) as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 406 also includes an integrated circuit die packaged within the communication chip 406. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a package substrate, comprising: a self-assembled monolayer (SAM) layer over a first dielectric, wherein the SAM layer includes a plurality of first end groups and a plurality of second end groups, and wherein the plurality of second end groups includes a plurality of hydrophobic moieties; and a conductive pad on the first dielectric, wherein the conductive pad has a bottom surface, a top surface, and a sidewall, and wherein the SAM layer surrounds and contacts a surface of the sidewall of the conductive pad.

In example 2, the subject matter of example 1 can optionally include that the plurality of hydrophobic moieties include a plurality of fluorinated moieties.

In example 3, the subject matter of examples 1-2 can optionally include that the top surface of the conductive pad is a substantially flat surface, wherein the substantially flat surface of the conductive pad is parallel to a top surface of the first dielectric, wherein the conductive pad includes a copper material, and wherein the sidewall of the conductive pad is a tapered sidewall or a substantially vertical sidewall.

In example 4, the subject matter of examples 1-3 can optionally include that the top surface of the conductive pad has a surface roughness that is approximately equal to a surface roughness of the as-plated copper material, and wherein the surface roughness of the top surface of the conductive pad includes a first roughness, a second roughness, or a third roughness.

In example 5, the subject matter of examples 1-4 can optionally include that the first roughness of the top surface of the conductive pad is approximately less than 2 nm, wherein the second roughness of the top surface of the conductive pad is approximately 1-18 nm, or wherein the third roughness of the top surface of the conductive pad is approximately 1-50 nm.

In example 6, the subject matter of examples 1-5 can optionally include that the SAM layer includes a top surface and a bottom surface that is opposite to the top surface, and wherein the bottom surface of the SAM layer is substantially coplanar to the bottom surface of the conductive pad.

In example 7, the subject matter of examples 1-6 can optionally include a second dielectric over the top surface of the SAM layer, wherein the second dielectric has a top surface and a bottom surface that is opposite to the top surface.

In example 8, the subject matter of examples 1-7 can optionally include that the plurality of first end groups includes one or more molecular compounds, wherein the one or more molecular compounds includes a silicon molecular compound, a nitrogen molecular compound, an oxygen molecular compound, an unsaturated aliphatic molecular compound, or an aromatic molecular compound, wherein the plurality of first end groups attaches to the bottom surface of the SAM layer and the top surface of the first dielectric, wherein the plurality of second end groups attaches to the top surface of the SAM layer, wherein the bottom surface of the second dielectric is above the plurality of second end groups of the SAM layer, and wherein the top surface of the second dielectric is substantially coplanar to the surface roughness of the top surface of the conductive pad.

In example 9, the subject matter of examples 1-8 can optionally include that the SAM layer has a thickness that is approximately 0.1 nm to 20 nm.

Example 10 is a method of forming a package substrate, comprising: disposing a resist over a first dielectric; patterning the resist to expose a surface of the first dielectric; disposing a SAM layer over the exposed surface of the first dielectric, wherein the SAM layer includes a plurality of first end groups and a plurality of second end groups, and wherein the plurality of second end groups includes a plurality of hydrophobic moieties; removing the resist to provide an opening in the SAM layer; disposing a conductive pad into the opening and on the first dielectric, wherein the conductive pad has a bottom surface, a top surface, and a sidewall, and wherein the SAM layer surrounds and contacts a surface of the sidewall of the conductive pad.

In example 11, the subject matter of example 10 can optionally include that the SAM layer includes a top surface and a bottom surface that is opposite to the top surface, and wherein the bottom surface of the SAM layer is substantially coplanar to the bottom surface of the conductive pad.

In example 12, the subject matter of examples 10-11 can optionally include that the SAM layer has a thickness that is approximately 0.1 nm to 20 nm.

In example 13, the subject matter of examples 10-12 can optionally include substantially removing the SAM layer over the first dielectric, wherein at least one or more of the second end groups of the SAM layer remain over the first dielectric; and disposing a second dielectric over the first dielectric, wherein the one or more of the second end groups are embedded between the first and second dielectrics, and wherein the second dielectric has a top surface and a bottom surface that is opposite to the top surface.

In example 14, the subject matter of examples 10-13 can optionally include that disposing the second dielectric over the top surface of the SAM layer when the SAM layer is not removed.

In example 15, the subject matter of examples 10-14 can optionally include that the plurality of hydrophobic moieties include a plurality of fluorinated moieties.

In example 16, the subject matter of examples 10-15 can optionally include that the top surface of the conductive pad is a substantially flat surface, wherein the substantially flat surface of the conductive pad is parallel to a top surface of the first dielectric, wherein the conductive pad includes a copper material, and wherein the sidewall of the conductive pad is a tapered sidewall or a substantially vertical sidewall.

In example 17, the subject matter of examples 10-16 can optionally include that the top surface of the conductive pad has a surface roughness that is approximately equal to a surface roughness of the as-plated copper material, and wherein the surface roughness of the top surface of the conductive pad includes a first roughness, a second roughness, or a third roughness.

In example 18, the subject matter of examples 10-17 can optionally include that the first roughness of the top surface of the conductive pad is approximately less than 2 nm, wherein the second roughness of the top surface of the conductive pad is approximately 1-18 nm, or wherein the third roughness of the top surface of the conductive pad is approximately 1-50 nm.

In example 19, the subject matter of examples 10-18 can optionally include that the plurality of first end groups includes one or more molecular compounds, wherein the one or more molecular compounds includes a silicon molecular compound, a nitrogen molecular compound, an oxygen molecular compound, an unsaturated aliphatic molecular compound, or an aromatic molecular compound, wherein the plurality of first end groups attaches to the bottom surface of the SAM layer and the top surface of the first dielectric, wherein the plurality of second end groups attaches to the top surface of the SAM layer, wherein the bottom surface of the second dielectric is above the plurality of second end groups of the SAM layer, and wherein the top surface of the second dielectric is substantially coplanar to the surface roughness of the top surface of the conductive pad.

Example 20 is a semiconductor packaged system, comprising: a substrate on a packaged substrate; and a die on the substrate, wherein the packaged substrate or the substrate include: a SAM layer over a first dielectric, wherein the SAM layer includes a plurality of first end groups and a plurality of second end groups, and wherein the plurality of second end groups includes a plurality of hydrophobic moieties; and a conductive pad on the first dielectric, wherein the conductive pad has a bottom surface, a top surface, and a sidewall, and wherein the SAM layer surrounds and contacts a surface of the sidewall of the conductive pad.

In example 21, the subject matter of example 20 can optionally include that the plurality of hydrophobic moieties include a plurality of fluorinated moieties, wherein the top surface of the conductive pad is a substantially flat surface, wherein the substantially flat surface of the conductive pad is parallel to a top surface of the first dielectric, wherein the conductive pad includes a copper material, wherein the sidewall of the conductive pad is a tapered sidewall or a substantially vertical sidewall, wherein the SAM layer includes a top surface and a bottom surface that is opposite to the top surface, and wherein the bottom surface of the SAM layer is substantially coplanar to the bottom surface of the conductive pad.

In example 22, the subject matter of examples 20-21 can optionally include that the top surface of the conductive pad has a surface roughness that is approximately equal to a surface roughness of the as-plated copper material, and wherein the surface roughness of the top surface of the conductive pad includes a first roughness, a second roughness, or a third roughness.

In example 23, the subject matter of examples 20-22 can optionally include that the first roughness of the top surface of the conductive pad is approximately less than 2 nm, wherein the second roughness of the top surface of the conductive pad is approximately 1-18 nm, or wherein the third roughness of the top surface of the conductive pad is approximately 1-50 nm.

In example 24, the subject matter of examples 20-23 can optionally include a second dielectric over the top surface of the SAM layer, wherein the second dielectric has a top surface and a bottom surface that is opposite to the top surface.

In example 25, the subject matter of examples 20-24 can optionally include that the plurality of first end groups includes one or more molecular compounds, wherein the one or more molecular compounds includes a silicon molecular compound, a nitrogen molecular compound, an oxygen molecular compound, an unsaturated aliphatic molecular compound, or an aromatic molecular compound, wherein the plurality of first end groups attaches to the bottom surface of the SAM layer and the top surface of the first dielectric, wherein the plurality of second end groups attaches to the top surface of the SAM layer, wherein the bottom surface of the second dielectric is above the plurality of second end groups of the SAM layer, wherein the top surface of the second dielectric is substantially coplanar to the surface roughness of the top surface of the conductive pad, and wherein the SAM layer has a thickness that is approximately 0.1 nm to 20 nm.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A package substrate, comprising:
   a self-assembled monolayer (SAM) layer over a first dielectric layer includes a top surface and a bottom surface opposite to the top surface and a second dielectric layer over a top surface of the SAM layer, wherein the SAM layer includes a plurality of first end groups and a plurality of second end groups, and wherein the plurality of second end groups includes a plurality of hydrophobic fluorinated moieties;
   a conductive pad on the first dielectric layer, wherein the conductive pad has a bottom surface, a top surface, and a sidewall, and wherein the SAM layer surrounds and contacts a surface of the sidewall of the conductive pad;
   wherein a top surface of the second dielectric layer is coplanar with the top surface of the conductive pad and the bottom surface of the SAM layer is coplanar with the bottom surface of the conductive pad and the top surface of the first dielectric layer;
   wherein the plurality of first end groups attaches to the bottom surface of the SAM layer and the top surface of the first dielectric layer and the plurality of second end groups attaches to the top surface of the SAM layer, wherein the bottom surface of the second dielectric layer is above the plurality of second end groups of the SAM layer.

2. The package substrate of claim 1, wherein the top surface of the conductive pad is a flat surface, wherein the flat surface of the conductive pad is parallel to the top surface of the first dielectric layer, wherein the conductive pad includes a copper material, and wherein the sidewall of the conductive pad is a tapered sidewall or a vertical sidewall.

3. The package substrate of claim 2, wherein the top surface of the conductive pad has a surface roughness that is approximately equal to a surface roughness of the as-plated copper material, and wherein the surface roughness of the top surface of the conductive pad includes a first roughness, a second roughness, or a third roughness.

4. The package substrate of claim 3, wherein the first roughness of the top surface of the conductive pad is approximately less than 2 nm, wherein the second roughness of the top surface of the conductive pad is approximately 1-18 nm, or wherein the third roughness of the top surface of the conductive pad is approximately 1-50 nm.

5. The package substrate of claim 1, wherein the second dielectric layer has a top surface and a bottom surface that is opposite to the top surface.

6. The package substrate of claim 5, wherein the plurality of first end groups includes one or more molecular compounds, wherein the one or more molecular compounds includes a silicon molecular compound, a nitrogen molecular compound, an oxygen compound, an unsaturated aliphatic molecular compound, or an aromatic molecular compound, wherein the plurality of first end groups attaches to the bottom surface of the SAM layer and the top surface of the first dielectric, wherein the plurality of second end groups attaches to the top surface of the SAM layer, wherein the bottom surface of the second dielectric is above the plurality of second end groups of the SAM layer, and wherein the top surface of the second dielectric is substantially coplanar to the surface roughness of the top surface of the conductive pad.

7. The package substrate of claim 1, wherein the SAM layer has a thickness that is approximately 0.1 nm to 20 nm.

8. A semiconductor packaged system, comprising:
   a substrate on a packaged substrate; and
   a die on the substrate, wherein the packaged substrate or the substrate include:
   a self-assembled monolayer (SAM) layer over a first dielectric layer includes a top surface and a bottom surface opposite to the top surface and a second dielectric layer over a top surface of the SAM layer, wherein the SAM layer includes a plurality of first end groups and a plurality of second end groups, and wherein the plurality of second end groups includes a plurality of hydrophobic fluorinated moieties;
   a conductive pad on the first dielectric, wherein the conductive pad has a bottom surface, a top surface, and a sidewall, and wherein the SAM layer surrounds and contacts a surface of the sidewall of the conductive pad;
   wherein a top surface of the second dielectric layer is coplanar with the top surface of the conductive pad and the bottom surface of the SAM layer is coplanar with the bottom surface of the conductive pad and the top surface of the first dielectric layer; and wherein the plurality of first end groups attaches to the bottom surface of the SAM layer and the top surface of the first dielectric layer and the plurality of second end groups attaches to the top surface of the SAM layer, wherein the bottom surface of the second dielectric layer is above the plurality of second end groups of the SAM layer.

9. The semiconductor packaged system of claim 8, wherein the top surface of the conductive pad is a flat surface, wherein the flat surface of the conductive pad is parallel to the top surface of the first dielectric layer, wherein the conductive pad includes a copper material, wherein the sidewall of the conductive pad is a tapered sidewall or a vertical sidewall.

10. The semiconductor packaged system of claim 9, wherein the top surface of the conductive pad has a surface roughness that is approximately equal to a surface roughness of the as-plated copper material, and wherein the surface roughness of the top surface of the conductive pad includes a first roughness, a second roughness, or a third roughness.

11. The semiconductor packaged system of claim 10, wherein the first roughness of the top surface of the conductive pad is approximately less than 2 nm, wherein the second roughness of the top surface of the conductive pad is approximately 1-18 nm, or wherein the third roughness of the top surface of the conductive pad is approximately 1-50 nm.

12. The semiconductor packaged system of claim 8, wherein the plurality of first end groups includes one or more molecular compounds, wherein the one or more molecular compounds includes a silicon molecular compound, a nitrogen molecular compound, an oxygen molecular compound, an unsaturated aliphatic molecular compound, or an aromatic molecular compound, wherein the top surface of the second dielectric layer is coplanar to the surface roughness of the top surface of the conductive pad, and wherein the SAM layer has a thickness that is approximately 0.1 nm to 20 nm.

* * * * *